United States Patent [19]

Abramson

[11] Patent Number: 4,871,949

[45] Date of Patent: Oct. 3, 1989

[54] LINE-SCAN CATHODE RAY TUBE

[76] Inventor: Albert Abramson, 6643 Mammoth Ave., Van Nuys, Calif. 91405

[21] Appl. No.: 227,466

[22] Filed: Aug. 2, 1988

Related U.S. Application Data

[63] Continuation of Ser. No. 6,493, Jan. 23, 1987, abandoned.

[51] Int. Cl.[4] ........................ H01J 29/52; H01J 29/70; H01J 29/50

[52] U.S. Cl. .................................... 315/382; 315/368; 313/409; 313/411

[58] Field of Search ...................... 315/368, 382, 392.1, 315/383; 313/409, 411, 414, 452, 453, 454

[56] References Cited

U.S. PATENT DOCUMENTS 3,740,607 6/1973 Silzars et al. ........................ 313/453

OTHER PUBLICATIONS

A. H. Rosenthal, "Television Picture Storage", *Electronic Engineering*, vol. XIV, No. 167, Jan., 1942, p. 578.

*Primary Examiner*—Thomas H. Tarcza
*Assistant Examiner*—Gregory C. Issing
*Attorney, Agent, or Firm*—Sheldon & Mak

[57] ABSTRACT

A cathode ray tube is disclosed which has a modulating grid for varying the charged particle flux density along a cross-section of a flat thin of charged particles or for varying the charged particle flux density in each of a plurality of charged particle beams arranged side-by-side in a sheaf. In a preferred embodiment, a cathode ray tube according to the invention includes a modulating grid and associated electronics that permit the tube to project a single line of video information simultaneously, thus increasing picture brightness. The beam scan is solely vertical, rather than horizontal and vertical, as in cathode ray tubes of the prior art.

21 Claims, 4 Drawing Sheets

LINE-SCAN CATHODE RAY TUBE

This is a continuation of co-pending application Ser. No. 006,493 now abandoned filed on 1/23/87.

BACKGROUND OF THE INVENTION

The field of the invention is that of apparatus for producing and controlling charged particle beams, and, in particular, apparatus for producing and controlling electron beams as in cathode ray or television tubes.

At present two primary systems of obtaining more brightness in a cathode-ray tube exist: the use of new, more efficient light-emitting phosphors; and an increase in the accelerating voltage. Both of these systems have approached their maximum efficiency and significant breakthroughs are not expected. However, brightness could also be increased by illuminating a complete line of video information simultaneously.

During the 1930's attempts were made by inventors such as von Bronk and Jefree to build large-screen television devices that would project a single line of video information simultaneously. The only successful machine was the "Scophony" large-screen television projector of Jefree. This projector used a special "supersonic" light valve with split-focus which, through the vibration of a piezoelectric crystal, set up a train of sonic waves in the liquid contained in a special tube or light cell. See, e.g., J. Stieger, "The Design and Development of Television Receivers using the Scophony Optical Scanning System," *Proceedings of the I.R.E.* (August 1939). A train of waves in the light cell had light and dark elements and represented a line of video information traveling in one direction. It was immobilized by means of a mirror wheel rotating rapidly in the opposite direction. As the light from an arc lamp went through the light cell, the light output of the light cell was modulated by the light and dark elements. A second rotating mirror wheel produced the frame scan. Tremendous brilliance could, therefore, be obtained from an ordinary light source. However, this process depended on mechanical devices and was soon abandoned. A wholly electronic system for producing simultaneous projection of single lines of video information in a cathode ray tube would offer significant advantages in reliability and brightness.

SUMMARY OF THE INVENTION

The invention comprises electronic means for simultaneously projecting single lines of video information. These means may comprise means for producing a flat, thin beam of charged particles or a plurality of beams of charged particles arranged side-by-side in a sheaf, and modulating means for selectively varying the charged particle flux density along a cross-section of the beam of charged particles or for varying charged particle flux density in each of the beams of charged particles. Means for storing information used to control the modulating means may also be provided, as well as switching means for selectively communicating information from the means for storing information to the modulating means.

A cathode ray tube embodiment of the invention is capable of projecting an entire line of video information at once. As a result, a brighter picture on the screen of a cathode ray tube will be produced because each video element is illuminated longer than would be the case for conventional line scanning, as employed in cathode ray tubes of the prior art. In theory the brightness could be increased by a multiplier equal to the number of elements of a line, all other factors being equal and assuming no persistence in the phosphor coating on the screen. Practical considerations and the persistence of the phosphor, however, are believed to limit this multiplier to less than half of that figure. The average number of elements in a line of video is 400; this will indicate the magnitude of the increase of brightness possible with the invention.

The invention should find wide application in the home projection market. It is compact and with the use of economic projection lenses (or Schmidt optics), of a sort well-known to the art, could easily fill an 8 foot by 10 foot screen in the home. Projection of theatre-size images as large as 40 feet on regular motion-picture screens is expected to be possible. The amount of heat generated by such a bright display may present a problem. However, several practical methods of cooling cathode-ray tubes are well-known to the art and can be applied to solve this problem.

Other applications of the invention are computer display, radar or other informational visual devices, and the like.

Thus, an object of the invention is to provide an improved cathode ray tube. A further object of the present invention is to provide a cathode ray tube capable of projecting an entire line of video information simultaneously. Other objects and features of the invention will become apparent to those skilled in the art in light of the following description and drawings of the preferred embodiment of the apparatus of the invention.

DETAILED DESCRIPTION OF THE PREFERRED EMBODIMENT

The cathode-ray tube according to the preferred embodiment of the invention uses conventional "electron optics" for producing and focusing an electron beam, in order to produce a plurality of electron beams (or an incrementally modulated electron beam) that are (or is) one television line high and approximately 400 television elements wide (according to the National Television Systems Committee (NTSC) standard; the invention may, of course, be easily adapted to other standards but the NTSC standard will be used in describing the preferred embodiment). This plurality of beams or single, incrementally modulated beam will be repeatedly moved across a cathode-ray screen perpendicular to its length within the time interval required to maintain persistence of vision and thereby exhibit a two-dimensional image on the screen.

Figure 1:
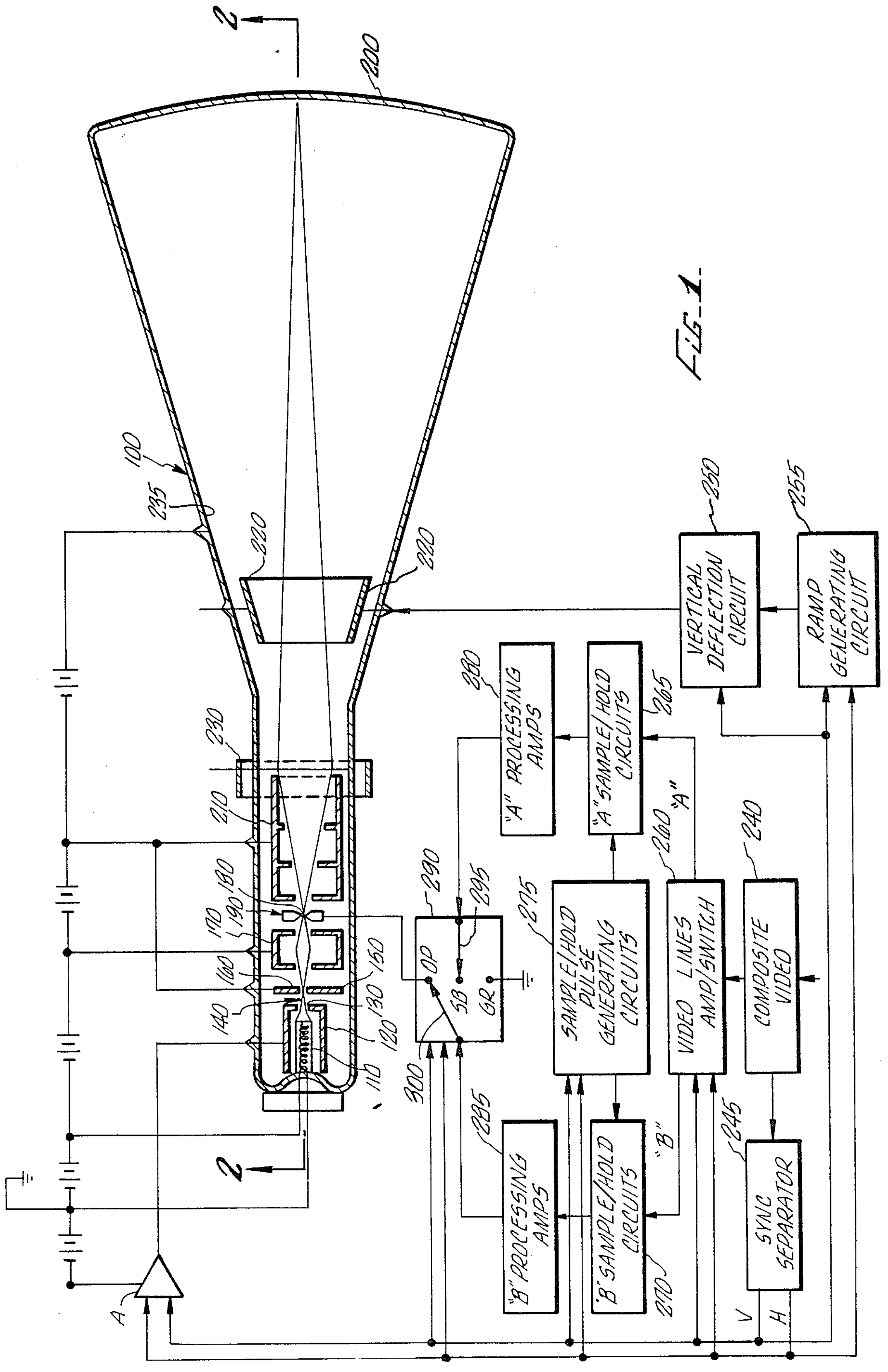
FIG. 1 is a side cross-section of the preferred embodiment of a cathode ray tube according to the invention together with a schematic of associated electronic circuitry for producing, focusing, and modulating the electron beam.
Figure 2:
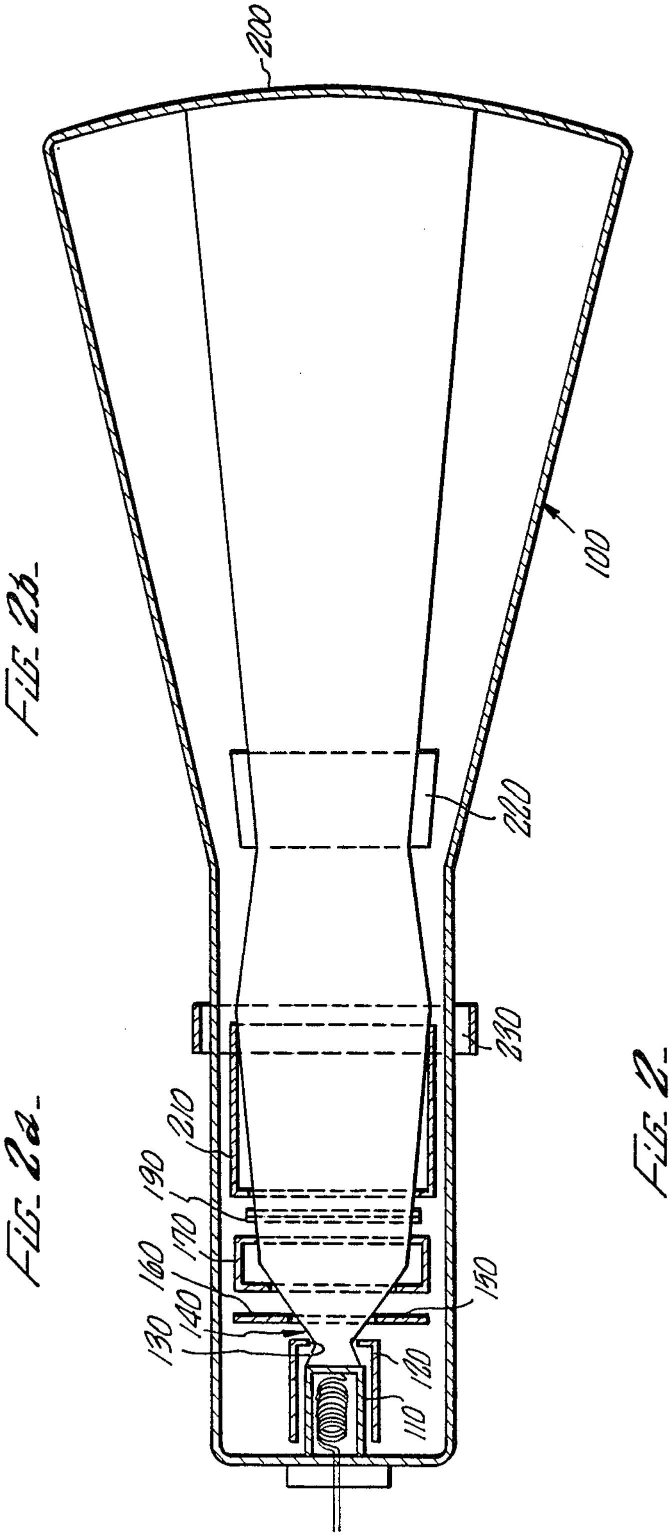
FIG. 2 is a top cross-section of the preferred embodiment of the invention, taken along section line 2—2 in FIG. 1.

Referring to FIGS. 1 and 2, the preferred embodiment uses the usual evacuated tube 100 made of an insulating material. Tube 100 has a screen 200 at one end that is coated on the inside with a phosphor material that emits light when struck by electrons. A hot cathode 110 that may be about one inch wide in a preferred embodiment is electrically heated in order to emit electrons from its surface. The cathode should preferably be heated to as uniform a glow as possible so that the electron emission is as even over the cathode as possible. Electrons are, of course, minute negatively charged particles whose speeds and courses are affected by electric and magnetic fields. The hot cathode is housed in an enclosure or filament shield 120 that may have a slit 130, or a rank of apertures 131, from which an electron beam or a plurality of electron beams arranged side-by-side in a sheaf may emanate.

Figure 2B:
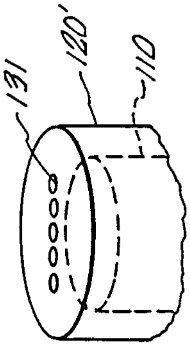
FIGS. 2*a* and 2*b* are partial perspective views of preferred embodiments of a filament shield and cathode for use in a cathode ray tube according to the invention.
Figure 2A:
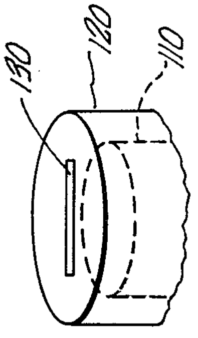

FIGS. 2*a* and 2*b* show two simplified versions of the enclosure 120; FIG. 2*a* shows a version with a slit 130 and FIG. 2*b* shows a version with apertures 131 (the number of apertures 131 shown in this simplified drawing is far fewer than needed for NTSC standard). For the discussion of the preferred embodiment, a continuous slit 130, as indicated in FIGS. 1 and 2, and thus one electron beam will be referred to for the sake of convenience. The multiple-beam preferred embodiment (the one using apertures 131 rather than slit 130 in enclosure 120), will be referred to only when the particulars of its construction and operation differ from the continuous-beam preferred embodiment.

Enclosure 120 is connected to a bias voltage selectively supplied by bias amplifier A, as discussed below. When enclosure 120 is sufficiently negatively biased, the electron beam cannot escape the slit 130 and the beam is "turned off." The electron beam is "turned off" except when a line of video information is to be projected.

The electron beam, identified generally by reference numeral 140, is attracted to an anode 150 which may have a potential of approximately 400 volts in the preferred embodiment. This anode has an aperture 160 in the form of a slit which flattens the beam (or beams in the multi-beam embodiment) so that it has a thin, flat cross-section corresponding to a line segment (or a dotted line segment in the multi-beam embodiment). The beam is focused and concentrated by a decelerating electrode 170 which forces the beam into a crossover 180 (best seen in FIG. 1) which has minimum area and maximum sensitivity, as well as the lineal cross-section just described. Modulating grid 190 is located in the vicinity of crossover 180.

The purpose of the modulating grid is to vary the electron flux density along the lineal cross-section of the beam passing by the modulating grid, in order to control the brightness of each video element on the screen 200 (also known as a pixel) in the line of projected video information. The more electron flux density at a particular point along the lineal cross-section of the beam, the greater the brightness of the video element corresponding to that point because more electrons will arrive to impact the phosphors coated on the inside of screen 200, thus creating greater luminescence of the phosphor and a brighter pixel.

If, however, slit 130 is apertured and electron beam 140 is thus formed of a plurality of separate electron beams, then the modulating grid will have the function of controlling the electron flux density of each electron beam passing by the modulating grid on its way to screen 200.

Figure 4:
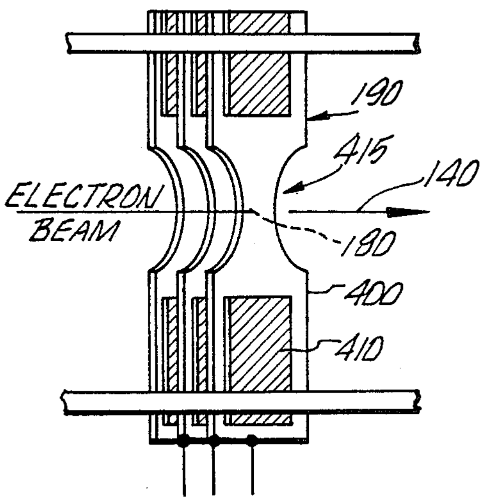
FIGS. 4, 5, and 6 are perspective views of portions of three preferred embodiments of the modulating grid of the invention.
Figure 5:
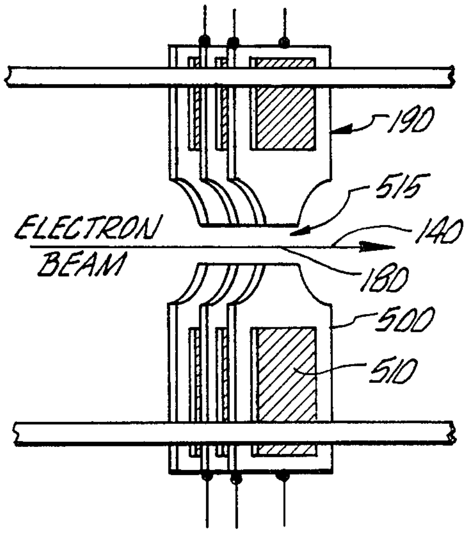
Figure 6:
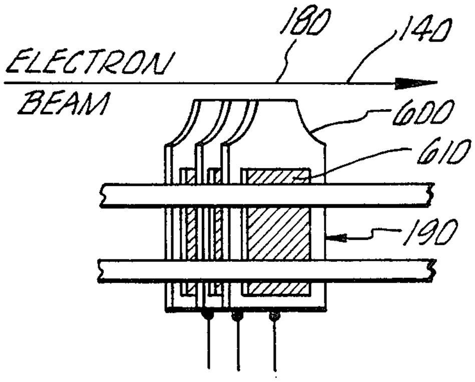

The modulating grid of the preferred embodiment comprises an assembly of a plurality of plates (also referred to as elements or conducting members) insulated from one another, mounted in the cathode ray tube next to crossover 180, and connected to sample/hold circuits, an embodiment of which will be described later. These plates are normally negatively biased by the sample/hold circuits in order to prevent the transmission of electron beam 140 past modulating grid 190. The plates may be selectively and more positively biased by the sample/hold circuits, as described below, to permit variable transmission of the electron beam at selected points. The number of plates will vary, of course, with the application of the invention. For the NTSC standard (525 lines), approximately 400 plates or elements will be needed; for the European standards (625 lines), approximately 500 plates or elements; and for High Definition standard (1100 lines), approximately 1,000 plates or elements. Some of the possible arrangements of the plates, conducting members or elements 400, 500 or 600, separated by insulators or insulating inserts 410, 510 or 610, may be seen in FIGS. 4, 5 or 6. FIGS. 4, 5 and 6 thus show some of the possible configurations of the modulating grid, all of which are believed to be satisfactory embodiments.

The potential or bias associated with each plate 400 (FIG. 4), 500 (FIG. 5) or 600 (FIG. 6) in the projected line corresponds to the relative brightness of each picture element on the phosphor-coated screen 200 of the cathode ray tube. That potential affects the electron flux density in the fraction of the beam 140 (or beams, in the multi-beam embodiment) passing the region of each plate 400, 500 or 600, as discussed before, and controls the electron flux reaching the area on screen 200 that corresponds to a picture element (pixel), by diminishing, diverting or turning back electrons in the beam at the crossover 180, in proportion to the potential. The potential of all the plates is normally negative so as to prohibit transmission of any electrons past the modulating grid, which will result in a dark screen. Varying positive bias may thus be selectively applied to the plates to permit passage of electron flux past individual plates, corresponding to individual video elements.

The plates may therefore be thought of as beam intensity control electrodes. The modulating grid sets up an electric potential gradient that modulates the static beam (or beams, in the multi-beam embodiment) in the same manner as a moving electron beam is modulated. The modulating grids in the preferred embodiments of FIGS. 4, 5, and 6 are each about 3 inches wide and about 1 inch high. In the embodiments of FIGS. 4 and 5, gaps or passages 415 or 515 exist in the plates 400 or 500 which may be about one television line high and permit the transmittal of the electron beam 140 (or beams). In the embodiment of FIG. 6, it has plates 600 adjacent to one side of the beam 140 (or beams) at the crossover 180.

Returning to FIG. 1, the electron beam goes (or beams go) through modulating grid 190 and is (or are) now accelerated by anode 210 which may have the same voltage as anode 150. It is (or they are) then deflected by a set of vertical deflection plates 220. No horizontal scanning of the beam is necessary. The modulated beam is (or beams are) deflected vertically across the screen one line at a time to produce an entire raster. For interlaced scanning, space is left for the missing lines. A focus coil 230 focuses the wide, modulated beam (or beams) back into having a line segment (or dotted line segment) cross-section for projection onto the screen. Finally, the modulated beam is (or beams are) accelerated by anode 235, which is a coating on the walls of the tube, to a final voltage, which may be in the tens of thousands of volts.

The circuitry that controls the modulating grid will now be described, with reference to the circuitry schematics of FIG. 1. A normal composite video signal 240 (monochrome or color) is sent to a synch separator 245 where the horizontal and vertical synchronizing (sync) signals are stripped off and separated, by means well known to the art. The sync signals are distributed to various circuits for timing purpose, as described below.

The vertical sync pulses are sent to the vertical deflection circuit 250. Vertical and horizontal sync pulses are also sent to a ramp generating circuit 255 which generates a staircase signal. This circuit ensures that the electron beam will be stationary during the duration of the horizontal line scan and then jump down to the next active line during the horizontal blanking interval.

The video information goes to video lines amplifier/-switch 260 where the video signals are amplified and separated. Alternate lines are sent to the "A" set of sample/hold circuits 265 or to the "B" set of sample/-hold circuits 270. Video information generated according to NTSC standard will contain 262.5 odd lines, then 262.5 even lines, then 262.5 odd lines, and so forth. The odd lines are projected to make a field, and then the even lines are projected (another field) interlaced with the odd lines, to make a complete frame. Whether odd or even, incoming lines of video information are assigned alternately to the "A" and "B" sets of sample/-hold circuits.

Thus, in the interlaced scan according to the NTSC standard, all lines in the first field are odd (1, 3, 5, etc.) and all lines in the second field are even (2, 4, 6, etc.). The first active line (line 1) in the first field is sent to the "A" set of sample/hold circuits. The second active line (line 3) is sent to the "B" set of sample/hold circuits. This continues for the duration of the first field. During the next (second) field, the first active line (line 2) is sent to the "A" set of sample/hold circuits and the next active line (line 4) is sent to the "B" set of sample/hold circuits, and so forth. This continues until the whole frame is completed.

In sequential (not NTSC standard) scanning, the first active line (line 1) is sent to the "A" set of sample/hold circuits and the second active line (line 2) is sent to the "B" set of sample/hold circuits, and so forth until the frame is completed. Thus, the video lines are sent sequentially to the "A" and "B" sets of sample/hold circuits, no matter what kind of signal (NTSC interlaced or sequential) is received by the apparatus. The cathode ray tube and associated circuitry will work regardless of what type of signal is received.

Horizontal sync pulses from the sync separator are sent to the sample/hold pulse generating circuits 275 which generate special timing pulses for opening and closing electronic gates or switches. These pulses are sent to the "A" and "B" sets of sample/hold circuits 265 and 270 where they are used to sequentially divide up the incoming video signals from the video lines amplifier/switch circuit 260. The sample/hold circuits contain circuitry that samples each video element (pixel) and stores it in either digital or analogue form. An analogue form will be discussed below. For the NTSC standard, each line of video (even or odd) requires at least 400 video elements stored in 400 separate sample/hold circuits (the following discussion will assume 400 video elements). Thus, the "A" and "B" sets of sample/hold circuits each contain 400 sample/hold circuits.

Figure 3:
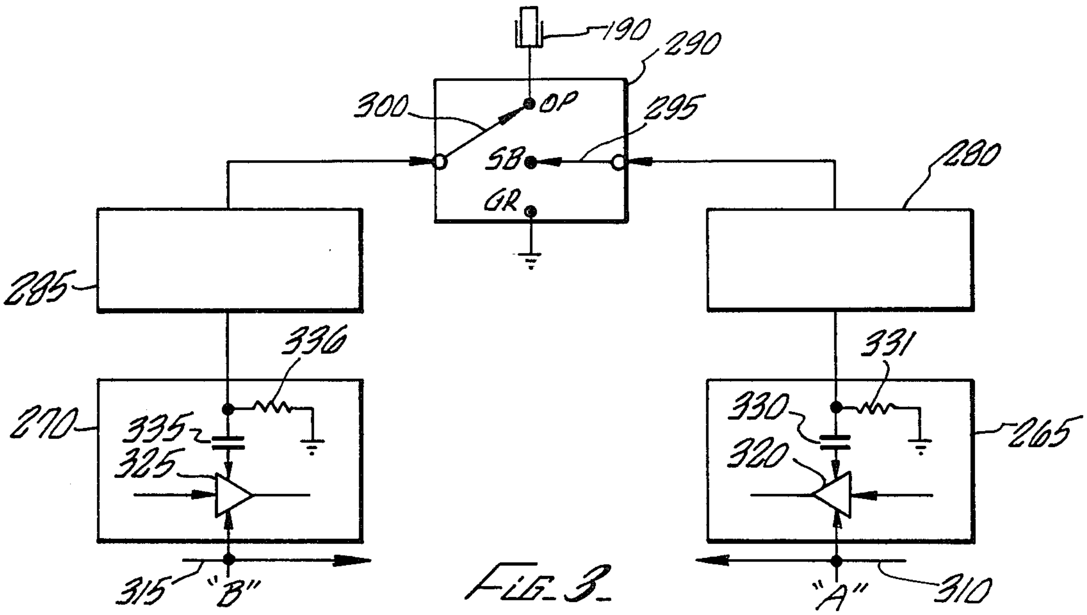
FIG. 3 is a schematic of the electronics for a single element of video for the preferred embodiment of the invention.

The preferred embodiment (see FIG. 3) of the "A" and "B" sample/hold circuits uses a multiple, tapped video line 310 or 315, respectively, that feeds the video signals to a parallel set of 400 capacitors. (Only a single sample/hold circuit and capacitor is shown in FIG. 3 for each of the "A" and "B" sets of sample/hold circuits 265 and 270.) By means of switching diodes or gates 320 ("A" set), 325 ("B" set), each element of video (pixel) is only allowed to go to a certain capacitor 330 ("A" set) or 335 ("B" set). A high resistance resistor 331 ("A" set) or 336 ("B" set) is connected to a ground on the side of the capacitor 330 or 335 away from the gate 320 or 325. This has been found necessary to prevent decay of the stored signal.

As the first pixel arrives, a sampling pulse from sample/hold pulse generator circuits 275 opens gate 320 or 325 and allows the video information of the first pulse to pass to the capacitor 330 or 335. As the second pixel arrives, the first gate 320 or 325 closes, the second gate in the set of sample/hold circuits opens and allows the video information of the second pixel to pass to the next capacitor in the set. This process continues until all of the pixels representing a line are stored and available for use. The stored charges are proportional to the brightness of each particular pixel. The timing of the gates is such that all 400 pixels (NTSC standard) will be stored in the duration of transmission of one line of video.

The 400 video element signals pass from the sample/-hold circuits to sets of processing amplifiers 280 or 285 where the signals can be amplified, trimmed or otherwise adjusted by means well known to the art. FIG. 3 shows only one processing amplifier each for the "A" and "B" sets of sample/hold circuits; the "A" and "B" sets each have a set of 400 identical processing amplifiers and the single one shown for each set of sample/-hold circuits is intended to represent the entire set of processing amplifiers. The eventual video element signals sent to the plates or conducting members in the modulating grid 190 may be positive voltage or bias signals, in contrast to the normal negative voltage or bias of the processing amplifiers, and thus permit portions of the electron beam to pass by the various plates in proportion to the strength of the signal. The processing amplifiers may also contain reverse bias diodes (not shown separately) between them and the modulating grid means to prevent any beam current from entering the sample/hold circuits.

The processing amplifiers are for adjusting purposes only, to ensure that the signal sent to the corresponding modulating grid plate is of negative bias if the particular video element received is dark. A negative bias corresponds to a dark pixel; a less negative or positive bias corresponds to a lighter pixel. Once set, the processing amplifiers can be ignored.

At the proper time, which will be explained later, the 400 signals are transferred (loaded) to modulating grid 190 by means of the electronic switching circuit 290.

Here they are used to modulate the stationary or static beam 140, as described before.

Electronic switching circuit 290 is fed with both vertical and horizontal sync pulses. It is a timing device which simply switches the path of the stored charges to create a bias in modulating grid 190. It has two sets of switches 295 and 300, one set for the "A" lines and another set for the "B" lines, respectively. (Only one switch in each set is shown in FIGS. 1 and 3.) The operation of each switch set is the same. The "A" line switch set will be explained. The switch set 295 has three positions. These positions are standby (SB), operate (OP) and ground (GR). As the video information is being stored in the sample/hold circuits 265, the "A" line switching set 295 is in the standby position (as shown in FIG. 1). Switching set 295 is connected to an open line when in that position. The purpose is to contain the stored signals in the sample/hold circuits 265 until the next timing signal occurs.

At the proper time, switch set 295 is switched to the operating position which is connected directly to the plates or conducting members in modulating grid 190. The stored charges from "A" sample/hold circuits 265, as modified by processing amplifiers 280, are then used to modulate the stationary electron beam 140 (or beams, in the multi-beam embodiment) to produce a line of video. The magnitude of the stored charges is proportional to the relative brightness of the pixels displayed on screen 200. At the end of the display of the "A" video line, the switch set 295 is briefly switched from the operating position to the ground position so that all of the charges in sample/hold circuits 265 are discharged. This unloads all of the capacitors in sample/-hold circuits 265, readying them for the second-to-next line of video information. (The "B" set of sample/hold circuits receive and store the next line of video information.) Switch set 295 then returns to the standby position to permit sample/hold circuits 265 to store the second-to-next line or next "A" line video element information. During the next horizontal sync period, the "B" switch set 300 now moves from the standby position to the operating position in order to permit the video information stored in "B" sample/hold circuits 270 and modified by processing amplifiers 285 to be applied to modulating grid 190, modulate stationary beam 140 (or beams) and thus to display the "B" line of video information. This process repeats itself until the entire raster is scanned.

Modulating grid 190 is made up of a multiplicity of plates or conducting members which are used to control the stationary wide electron beam (or beams, in the multi-beam embodiment), as previously described. Since each conducting member will modulate or control the amplitude of that part of the beam (or that beam) passing through or by it, the brightness of the electron beam (or beams) projected on the screen will be modulated just as though it (or they) were a moving beam (or beams). Each pixel will have the correct relative amount of brightness to correspond to that at the scene.

Operation of the cathode ray tube will now be explained for interlaced scanning according to the NTSC standard. Normally, in a cathode ray tube of the prior art the scanning electron beam returns to the upper left side of the raster (as viewed from the front of the cathode ray tube) during the vertical blanking interval. No such horizontally scanned beam is used in practicing the invention. The vertical deflection plates 220 receive voltages from vertical deflection circuit 250 that will position the complete first odd line of video at the top of the raster.

At the end of the vertical blanking interval and the beginning of the first active (odd) line, line 1, the video information is fed by the video amp/switch 260 to "A" sample/hold circuits 265. Here the video information are distributed to the 400 sample/hold circuits and to processing amplifiers 280. At the end of line 1, the front porch of the first horizontal sync pulse activates electronic switch circuit 290 so that switch set 295 moves from standby to the operating position, which transfers the video signals into the modulating grid 190. The video information is now ready to be used. The back porch of the horizontal sync pulse now triggers a switch in bias amp A which turns off the negative bias on filament shield 120 and the flat, thin beam 140, (or beams, in the multi-beam embodiment) passes through the modulating grid means 190 to present a complete line of video to the screen 200. This presentation may take the full 59.3 microseconds of a normal line scan (NTSC standard). It may also start later and/or be cut off earlier (this depends on the time constants of the resistance/capacitance of the sample/hold circuits). Meanwhile, the "B" set of sample/hold circuits are receiving and storing the next odd line of video information, line 3.

At the end of the first scanning line, as the front porch of the first horizontal sync pulse occurs, a switch in bias amp A turns on the negative voltage to filament shield 120 which again biases off electron beam 140. Electronic switching circuit 290 briefly positions switch set 295 from the operating position to the ground position, thus discharging sample/hold circuits 265 and therefore freeing modulating grid 190 for fresh video information from the next line. Sample/hold circuits 265 are also now ready to receive information from the next odd line, line 5 (all odd lines are displayed first to get one field, then all even lines to get another field and thus a complete frame, per NTSC standard). Immediately thereafter, electronic switching circuit 290 causes switch set 300 to move from the standby position to the operating position, allowing the stored video information of odd line 3 in "B" sample/hold circuits 270 to be transferred to the modulating grid means 190. This takes place within the duration of the horizontal sync pulse.

At the back porch of the horizontal sync pulse, bias amp A turns off the negative voltage to filament shield 120 which reestablishes electron beam 140 (or beams, in the multi-beam embodiment) to pass through the modulating grid 190. The electron beam 140 (or beams) now passes (or pass) through the modulating grid 190 where it is (or they are) modulated with the information for the second odd line, line 3, and proceeds, properly deflected by the vertical deflection circuit, to the screen where that line is displayed.

All 400 pixels of line 3 appear simultaneously. In the preferred embodiment, as mentioned, the display lasts for about 59.3 micro-seconds. The image will decay (not instantaneously) thereafter, due to persistence of the phosphors of the display screen. Theoretically, and assuming no persistence of the phosphor of the display screen, with all 400 pixels lit simultaneously, an increase in the brightness factor of about 400 times over a cathode ray tube of the prior art should be observed, all other factors, e.g. biasing voltages, being the same. But practical calculations based on the phenomenon of persistence of the phosphors of the display screen suggest a more modest figure of from 50 to 100 times the brightness of a cathode-ray tube of the prior art is possible.

The process described above continues until the last line of the frame is "scanned" or displayed. At the beginning of the vertical blanking interval, bias amp A turns on the negative voltage on filament shield 120, thus stopping all electron flow through modulating grid means 190 and the screen will go dark. Electronic switching circuit 290 now switches the sample/hold circuits for the last odd line displayed to ground. The vertical deflection circuit also is re-set to position the first even line in its proper place. The system is now ready for the display of video information from the first even line of the second frame and the whole process repeats itself.

The invention may be used for large-screen television in a single cathode ray tube color configuration (three cathode ray tubes, one each in the colors red, blue, and green, could also be used and their images combined in ways well known to the art). The single cathode ray tube configuration will require the use of three (red, blue, and green) "guns" according to the invention, "guns" referring to the beam-producing cathode and anodes described above. The cathode ray tube of the invention can, in fact, be built in two color versions, as described below.

Figure 7:
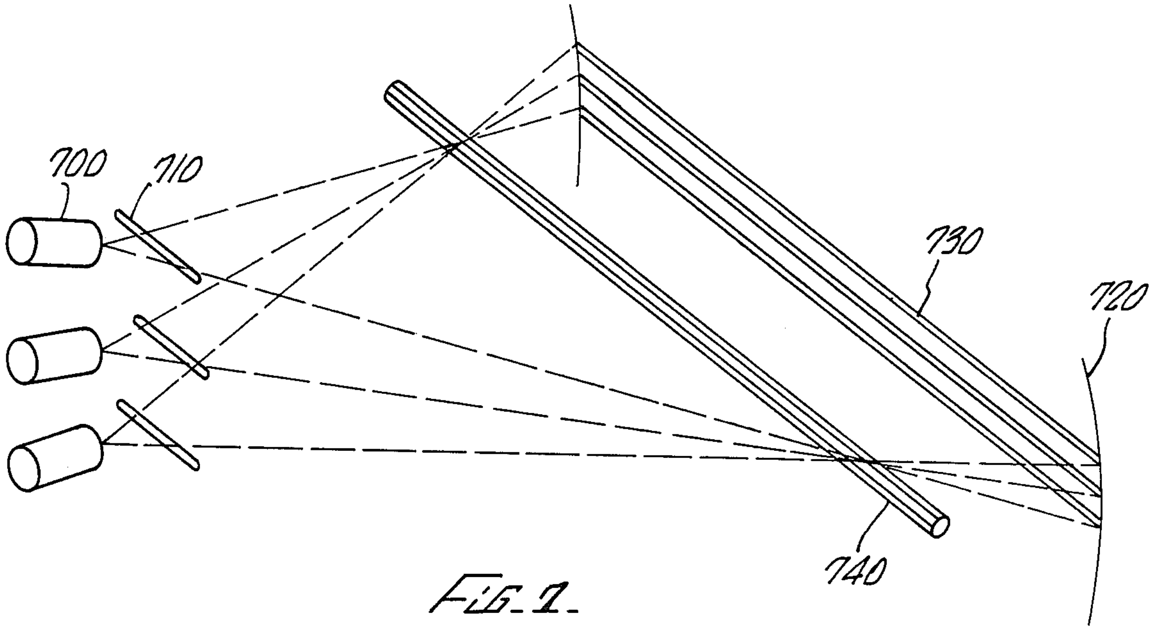
FIGS. 7 and 8 show simplified perspective views of two preferred embodiments of a color version of the invention.

The horizontal color version uses three guns and three modulating grids, all of which are stacked vertically. A simplified diagram of this format, omitting detail, may be seen in FIG. 7, in which the guns 700 (referring to the cathodes and anodes used to produce the broad unmodulated electron beam), and modulating grids 710 are shown projecting three horizontal lines of video onto screen 720. Deflection and focusing apparatus is omitted from FIG. 7. This configuration has three guns and modulating grids. The color phosphors on the screen 720 are in horizontal stripes or parallel linear elongated light emitting areas 730, each of which is a different color. Masks or slits 740 may be used for the color separation.

Figure 8:
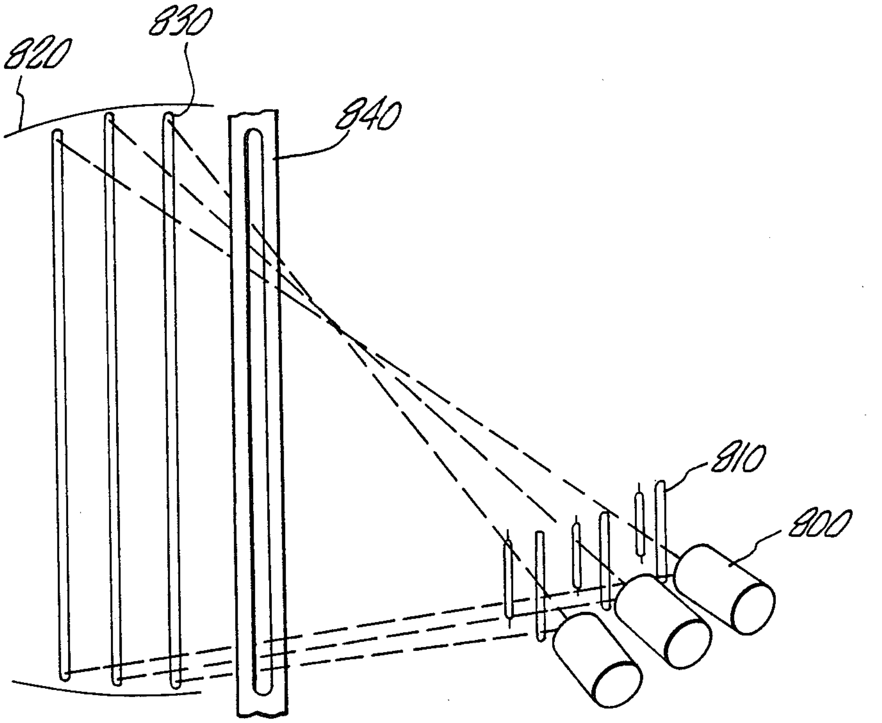

The vertical color version (FIG. 8) uses three guns 800 and three modulating grids 810. The colors are in vertical stripes 830 on screen 820 with corresponding masks 840. The modulating grids are aligned horizontally with respect to each other and a complete or at least a half of a television frame (not a line) is presented at one time. The scan is horizontal, at a line rate; vertical deflection is not needed. However, in this mode, more than one line of information must be stored; at least a whole field, of 262.5 lines (NTSC Standard), must be stored. While this seems cumbersome, the vertical color version may be of tremendous value when used with a bandwidth-reduction device. Since so much information must be stored for the display, it may be possible to furnish only new data and just repeat the redundant stored video information.

Thus, preferred embodiments of the invention have been illustrated and described with reference to the accompanying drawings. Those with skill in the art will understand that these preferred embodiments are given by way of example only. Various changes and modifications may be made without departing from the scope and spirit of the invention, which is intended to be defined by the appended claims.

What is claimed is:

1. A charged particle beam controller, comprising:

(a) means for producing a flat, thin beam of charged particles;

(b) modulating means comprising a plurality of conducting members for varying charged particle flux density along a cross-section of the beam of charged particles, the conducting members being aligned side-by-side adjacent the cross-section and capable of being independently biased in order to selectively diminish the flux density in the fraction of the beam passing each conductor member;

(c) means for storing information for a complete line of video, the information being used to bias the conducting members of the modulating means;

(d) switching means for selectively communicating information from the means for storing information to the modulating means, in order to control the modulating means;

(e) means for incrementally deflecting the flat, thin beam of charged particles in a direction perpendicular to the plane of the flat, thin beam of charged particles, the deflection means being positioned with respect to the modulating means so as to deflect the flat, thin beam of charged particles after the flat, thin beam of charged particles has passed the modulating means whereby the charged particle beam controller is capable of projection of the complete line of video simultaneously between each incremental deflection of the flat, thin beam of charged particles.

2. The charged particle beam controller according to claim 1 in which the modulating means for varying charged particle flux density comprises a plurality of conducting members disposed along the cross-section of the beam and the information used to control the modulating means is electric charge.

3. A charged particle beam controller, comprising:

(a) means for producing a plurality of beams of charged particles arranged side by side in a sheaf;

(b) modulating means comprising a plurality of conducting members for varying charged particle flux density in each of the plurality of side-by-side beams of charged particles, the conducting members being aligned side-by-side adjacent the plurality of beams and capable of being independently biased in order to selectively diminish the flux density in the beam passing each conducting member;

(c) means for storing information for a complete line of video, the information being used to control the modulating means;

(d) switching means for selectively communicating information from the means for storing information to the modulating means, in order to control the modulating means;

(e) means for incrementally deflecting the sheaf of beams of charged particles in a direction perpendicular to the plane in which the sheaf of charged particle beam lies, the deflection means being positioned with respect to the modulating means so as to deflect the sheaf of charged particle beams after the sheaf of charged particle beams has passed the modulating means whereby the charged particle beam controller is capable of projection of the complete line of video simultaneously between each incremental deflection of the sheaf of beams of charged particles.

4. The charged particle beam controller according to claim 3 in which the modulating means for varying charged particle flux density in the plurality of charged particle beams comprises a plurality of conducting members, at least one conducting member per charged particle beam, disposed along a cross-section of the sheaf of charged particle beams and the information used to control the modulating means is electric charge.

5. A cathode ray tube, comprising:

(a) means for producing and focusing an electron beam into a flat thin beam both at a screen at an end of the cathode ray tube as well as at a cross-over region of the beam;

(b) modulating grid means comprising a plurality of conducting members disposed proximate to the electron beam at the cross-over region, each of the members being capable of being independently biased in order to selectively diminish the electron flux density in a fraction of the beam passing the conducting member and thus to control the amount of the electron flux density in the fraction of the electron beam;

(c) means for selectively biasing the conducting members so that the beam will project a complete line of video simultaneously; and (d) means for vertically deflecting the electron beam across the screen between the projection of each line of video, the deflection means being positioned with respect to the modulating grid means so as to deflect the electron beam after the electron beam has passed the modulating grid means.

6. The cathode ray tube according to claim 5, in which the screen is a phosphor-coated luminescent screen which is illuminated by the beam.

7. The cathode ray tube according to claim 5, in which the means for producing and focusing an electron beam is a plurality of electrodes capable of producing a focused flat thin electron beam at the screen which beam is as wide as the luminescent screen and which corresponds to one line of video.

8. The cathode ray tube according to claim 5, in which the means for selectively charging the conducting members comprises a plurality of sets of sample/hold circuits for storing charges to selectively bias the conducting members of the modulating grid, switching means for selecting the set of sample/hold circuits that supply biasing voltage to the modulating grid, and grounding means for grounding the modulating grid.

9. The cathode ray tube according to claim 8 in which the sample/hold circuits further comprise a plurality of means for storing charges, each of the means for storing charges being stored with the charge of a video element derived from a video signal.

10. The cathode ray tube according to claim 9 further comprising processing amplifiers in series with the sample/hold circuits to modify the signals stored by the sample/hold circuits.

11. The cathode ray tube according to claim 9 in which the charge storage means are capacitors.

12. The cathode ray tube according to claim 5, in which the conducting members are conducting plates which contain passages for the transmittal of the electron beam.

13. The cathode ray tube according to claim 5, in which the conducting members are conducting plates which contain gaps for the transmittal of the electron beam.

14. The cathode ray tube according to claim 5, in which the conducting members are conducting plates which are disposed at one side and adjacent to the cross-over region.

15. A cathode ray tube, comprising:

(a) means for producing and focusing a plurality of electron beams arranged side-by-side in a sheaf and having a cross-over point;

(b) a screen at an end of the cathode ray tube;

(c) modulating grid means comprising a plurality of conducting members, at least one conducting member per electron beam, disposed side-by-side proximate to the plurality of electron beams at the cross-over region, each of the members being capable of being independently biased in order to selectively diminish the electron flux density in the adjacent electron beam passing the conducting member and thus to control the amount of electron flux density in the electron beam;

(d) means for selectively biasing the conducting members so that the beam will project a complete line of video simultaneously; and (e) means for vertically deflecting the plurality of electron beams across the screen between the projection of each line of video, the deflection means being positioned with respect to the modulating grid means so as to deflect the plurality of electron beams after the plurality of electron beams has passed the modulating grid means.

16. Television apparatus for projection of composite video signals comprising:

a. at least one cathode ray tube comprising:

(1) at least one cathode;

(2) a plurality of control and focusing anodes, at least one of the anodes containing a slit for permitting passage of an electron beam which is flat and thin at the anode having the slit, at a cross-over point further along in the passage of the beam, and at a screen on an end of the cathode ray tube;

(3) a modulating grid comprising a plurality of conducting plates and a plurality of insulators disposed between and separating the conducting plates, the modulating grid being disposed in or proximate to the electron beam at the crossover of the electron beam;

(4) deflection means for deflecting the electron beam in a direction perpendicular to its width.

b. deflection circuitry responsive to synch signals contained in a composite video signal, for biasing the deflection means;

c. circuitry for selectively biasing the conducting plates responsive to the composite video signal, comprising:

(1) first switching means to separate lines of video information in the composite video signal, responsive to horizontal synch signals in the composite video signal;

(2) a plurality of sets of sample/hold circuits which receive lines of video information from the first switching means, each set of sample/hold circuits having a plurality of sample/hold circuits at least equal in number to the number of conducting plates and receiving and storing one line of video information at the rate of one sample/hold circuit per element of video information;

(3) a plurality of sets of processing amplifiers for modifying and trimming the video information stored in the sample/hold circuits, each set of processing amplifiers being matched with a set of sample/hold circuits and in series with the set of sample/hold circuits, the processing amplifiers being capable of being set to a normally negative bias that when applied to the conducting plates prevents transmission of the electron beam past the modulating grid;

(4) a plurality of sets of second switching means, the number of sets of second switching means being at least equal in number to the number of sets of sample/hold circuits, and each set containing a number of second switching means at least equal in number to the number of sample/-hold circuits in an associated set of sample/hold circuits, each second switching means having a grounded position in which an associated sample/hold circuit and associated processing amplifier are grounded, a standby position in which the associated sample/hold circuit and associated processing amplifier are attached to an unterminated open line, and an operating position in which the associated sample/hold circuit and associated processing amplifier are connected to a conducting plate in the modulating grid to selectively bias the conducting plate depending on the element of video information stored in the sample/hold circuit, each second switching means being responsive to the vertical and horizontal synch signals contained in the composite video signal in order to switch between the grounding, standby and operating positions;

d. a bias amplifier for turning on and off the electron beam by negatively biasing at least one of the anodes, the bias amplifier being responsive to vertical and horizontal synch signals contained in the composite video signal to turn off the electron beam during horizontal and vertical blanking intervals.

17. Color television apparatus, comprising:

(a) an image-producing display screen;

(b) plural groups of individual, parallel linear elongated light-emitting areas upon the screen, each of the elongated areas of one group constituted to produce a color of light different from that of other areas in that one group;

(c) at least one electron beam-producing means for producing an electron beam substantially as wide as an elongated light-emitting area, the electron beam-producing means being positioned with respect to the display screen so as to be capable of directing the electron beam onto the display screen;

(d) a plurality of independently biasable element means arranged side-by-side and associated with the beam-producing means to modulate the intensity of the electron beam along the width of the electron beam so that the beam will project a complete line of video simultaneously; and (e) deflecting means for directing the electron beam impressed with image information at successive elongated areas on the screen to cause the successive elongated areas to emit light, the deflecting means being positioned with respect to the element means so as to deflect the electron beam after the electron beam has passed the element means.

18. The apparatus according to claim 17 in which each of the plurality of element is a separate beam-intensity control electrode.

19. The apparatus of claim 17, in which the extent of each of the light-emitting areas is a television line.

20. The apparatus of claim 17 in which the different colors are red, green, and blue.

21. The apparatus according to claim 17 further comprising sample/hold circuits for receiving, storing, and transmitting image information to the plurality of elemental means.

* * * * *

UNITED STATES PATENT AND TRADEMARK OFFICE
CERTIFICATE OF CORRECTION

PATENT NO. : 4,871,949

DATED : October 3, 1989

INVENTOR(S) : Abramson, Albert

It is certified that error appears in the above-identified patent and that said Letters Patent is hereby corrected as shown below: On the title page:

IN THE "REFERENCES CITED" SECTION:

The following references should be added to the "References Cited" section of the Patent:

U.S. PATENT DOCUMENTS

| | | | |
|---|---|---|---|
| 4,626,899 | 12/1986 | Tomii, et al. | 315/366 |
| 4,598,234 | 7/1986 | McKibben | 315/367 |
| 4,227,117 | 1980 | Watanabe, et al. | 315/135 |
| 4,095,144 | 1978 | Mendelsohn | 315/382 |
| 3,980,919 | 1976 | Bates, et al. | 313/453 |
| 3,935,500 | 1976 | Oess, et al. | 313/495 |
| 3,678,330 | 1972 | Landrum | 315/13R |
| 3,678,329 | 1972 | Miyaoka | 315/13R |
| 3,671,956 | 1972 | Kegelman, et al. | 340/324A |
| 3,408,532 | 1968 | Hultberg, et al. | 315/12 |
| 3,383,547 | 1968 | Alpers | 315/13 |
| 3,151,272 | 1964 | Crowell | 313/453 |
| 3,092,746 | 1963 | Smura | 315/382 |

CERTIFICATE OF CORRECTION

PATENT NO. : 4,871,949

DATED : October 3, 1989

INVENTOR(S) : Abramson, Albert

It is certified that error appears in the above-identified patent and that said Letters Patent is hereby corrected as shown below:

| | | | |
|---|---|---|---|
| 3,090,890 | 1963 | Vieth, et al. | 315/21 |
| 3,068,317 | 1962 | Boothroyd | 178/5.4 |
| 2,926,283 | 1960 | Bruining, et al. | 315/21 |

OTHER PUBLICATIONS

J. Steiger, "The Design and Development of Television Receivers Using the Scophony Optical Scanning System," Proc. I.R.E.E. (Aug.1939)

A. Abramson, Electronic Motion Pictures (Univ. Calif. Press 1955), at 98-101

A. Sobel, "Summary: New Techniques in Video Displays," I.E.E.E. Transaction on Consumer Electronics, Vol. CE-21 (August 1975)

IN THE ABSTRACT:

In line 3 of the abstract, insert --beam-- after the words "flat thin".

UNITED STATES PATENT AND TRADEMARK OFFICE
CERTIFICATE OF CORRECTION

PATENT NO. : 4,871,949

DATED : October 3, 1989

INVENTOR(S) : Abramson, Albert

It is certified that error appears in the above-identified patent and that said Letters Patent is hereby corrected as shown below:

In Claim 6, column 11, line 28 of the Patent, insert --or 15-- after "Claim 5".

In Claim 7, column 11, line 31 of the Patent, insert --or 15-- after "Claim 5".

In Claim 8, column 11, line 37 of the Patent, insert --or 15-- after "Claim 5".

In Claim 12, column 11, line 56 of the Patent, insert --or 15-- after "Claim 5".

In Claim 13, column 11, line 60 of the Patent, insert --or 15-- after "Claim 5".

In Claim 14, column 11, line 64 of the Patent, insert --or 15-- after "Claim 5".

UNITED STATES PATENT AND TRADEMARK OFFICE
CERTIFICATE OF CORRECTION

PATENT NO. : 4,871,949

DATED : October 3, 1989

INVENTOR(S) : Abramson, Albert

It is certified that error appears in the above-identified patent and that said Letters Patent is hereby corrected as shown below:

In claim 18, column 14, line 27 of the Patent, insert --means-- after "element".

Signed and Sealed this

Fourth Day of December, 1990

Attest:

HARRY F. MANBECK, JR.

Attesting Officer

Commissioner of Patents and Trademarks